(12) United States Patent
Balance

(10) Patent No.: US 8,904,325 B2
(45) Date of Patent: Dec. 2, 2014

(54) VERIFICATION TEST SET AND TEST BENCH MAP MAINTENANCE

(71) Applicant: Mentor Graphics Corporation, Wilsonville, OR (US)

(72) Inventor: Matthew Balance, Milwaukie, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/755,686

(22) Filed: Jan. 31, 2013

(65) Prior Publication Data

US 2013/0198709 A1  Aug. 1, 2013

Related U.S. Application Data

(63) Continuation of application No. 13/362,791, filed on Jan. 31, 2012, now abandoned.

(51) Int. Cl.
*G06F 17/50* (2006.01)

(52) U.S. Cl.
CPC ........ *G06F 17/5081* (2013.01); *G06F 17/5022* (2013.01)
USPC ............................ 716/111; 716/103; 716/104

(58) Field of Classification Search
CPC  G06F 17/5022; G06F 17/5081; G06F 17/505
USPC .......................................... 716/103, 104, 111
See application file for complete search history.

(56) References Cited

U.S. PATENT DOCUMENTS

2003/0145288 A1\* 7/2003  Wang et al. ...................... 716/2

\* cited by examiner

*Primary Examiner* — Vuthe Siek
(74) *Attorney, Agent, or Firm* — Banner & Witcoff, Ltd.

(57) ABSTRACT

Aspects of the invention provide for the maintenance of user modified portions of a map between a test bench and a test set generator during an iterative electronic design process. Various implementations of the invention provide for matching sections within a design for an electronic device with corresponding sections in a map between the elements in the design to elements in a graph representation of the design. The matched sections are then compared to determine if any discrepancies exists, such as, for example, if the design has been recently changed. If any discrepancies do exist, then it is determined whether the section of the map can be updated or must be replaced entirely to resolve the discrepancies. Various implementations of the invention provide that the process can be repeated during an iterative design flow such that as the design is modified during the iterative design flow, the map can be updated to reflect the changes.

20 Claims, 4 Drawing Sheets

VERIFICATION TEST SET AND TEST BENCH MAP MAINTENANCE

CROSS REFERENCE TO RELATED APPLICATIONS

This application is a continuation of Ser. No. 13/362,791, filed on Jan. 31, 2012.

FIELD OF THE INVENTION

The present invention is directed towards the verification of electronic designs. More specifically, various implementations of the invention are applicable to maintaining a mapping between a test bench and a test set generation tool during an iterative electronic device design process.

BACKGROUND OF THE INVENTION

Electronic devices are used in a variety of products, from personal computers to automobiles to toys. There are various different types of electronic devices, such as, for example, an integrated circuit. Furthermore, as those of skill in the art will appreciate, electronic devices can be connected, to form other electronic devices or systems. The designing and fabricating of electronic devices typically involves many steps, sometimes referred to as the "design flow." The particular steps of a design flow often are dependent upon the type of electronic device, its complexity, the design team, and the fabricator that will manufacture the device.

Several steps are common to most design flows. Initially, the specification for a new design is expressed, often in an abstract form and then transformed into lower and lower abstraction levels until the design is ultimately ready for manufacture. The process of transforming the design from one level of abstraction to another is referred to as synthesis. At several stages of the design flow, for example, after each synthesis process, the design is verified. Verification aids in the discovery of errors in the design, and allows the designers and engineers to correct or otherwise improve the design. The various synthesis and verification processes are facilitated by electronic design automation (EDA) tools.

As those of ordinary skill in the art will appreciate, the synthesis and verification processes applied to modern designs are quite complex and include many different steps. An illustrative design flow, for an integrated circuit, for example, can start with a specification for the integrated circuit being expressed in a high-level programming language, such as, for example, $C^{++}$. This level of abstraction is often referred to as the algorithmic level. At this abstraction level, the functionality of the design is described in terms of the functional behavior applied to specified inputs to generate outputs. The design will then be synthesized into a lower level of abstraction, typically, the logic level of abstraction. At this level of abstraction, the design is expressed in a hardware description language (HDL) such as Verilog, where the circuit is described in terms of both the exchange of signals between hardware registers and the logical operations that are performed on those signals. As this stage, verification is often performed to confirm the functional behavior of the design, i.e. that the logical design conforms to the algorithmic specification.

After the logical design is verified, it is synthesized into a device design. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. Verification is again performed at this stage in order to confirm that the device design conforms to the logical design, and as a result, the algorithmic specification.

Once the components and their interconnections are established, as represented by the device design, the design is again synthesized, this time into a physical design that describes specific geometric elements. The geometric elements define the shapes that will be created in various layers of material to manufacture the circuit. This type of design often is referred to as a "layout" design. The layout design is then used as a template to manufacture the integrated circuit. Verification is typically performed again at this stage, to ensure that the layout design conforms to the device design.

As those of ordinary skill in the art will appreciate, modern design flows are often an iterative process. More specifically, the design flow steps of synthesizing the design, verifying the synthesized design, and then modifying the design based on the results of verification are often repeated a number of times. This iterative process can become even further complicated as design goals and objectives change during development. Any such changes will further necessitate additional modifications to the design. In turn, additional synthesis and verification process must be repeated.

Although there are different methods of performing verification, this invention is directed towards verification processes that "exercise" a design by applying input to the design and capturing the output resulting from application of the input. The applied input is often referred to as an input sequence. The captured output then is compared to the output the design should have produced according to the input sequence and the specification. Various technologies exist for exercising a design, for example, the response (i.e. the output) of the design to the input sequence, may be simulated. In some cases the output may be captured from an emulator, emulating the design with the input sequence as stimulus for the emulation. A prototype may also be used to generate the output. Those of ordinary skill in the art will appreciate that combinations of simulation, emulation, and prototyping could be used during verification and that various combinations of technologies can be employed to implement a verification system as described here. Typically, the tools used to exercise a design as described above are referred to as the "test bench."

Verification typically consists of applying multiple input sequences, referred to as a test set and capturing each resulting output, referred to as an output set. The outputs from the output set then are compared to the corresponding expected outputs. There are many ways to generate test sets. For example, directed tests, that is, where the input sequences are directly specified by a designer can be used. Random combinations of inputs can also be selected and used to form input sequences. Although ideally one would generate an input sequence that corresponds to all possible input combinations, the set of all possible input sequences to a modern electronic design is so large that it is not computationally feasible to exhaustively test the design in this manner. As a result, another approach to generating input sequences for verification, referred to as coverage-based verification is often used.

With a coverage-based verification process, constraints on the set of all possible inputs are specified, and then input sequences that satisfy these constraints are generated. More specifically, the potential inputs that may be selected to form an input sequence from are restricted by using constraints. Then input sequences are generated from, the remaining (i.e. unrestricted) inputs. Typically, inputs, input values, and combinations of inputs or input values that are required to exercise portions of the design's functionality are identified. Constraints then are written based on these identified inputs and input values. The set of constraints is often referred to as a coverage model. Verification progress then is measured by achieving the coverage described by the coverage model. More specifically, an acceptable level of verification is selected where input sequences corresponding to some portion of the coverage model are generated and included in the test set during verification. As the coverage model is often based on key features and functions of the design, it is often desirable that input sequences which exercise the entire coverage model be generated. Tools, referred to herein as "test set generators" are available that provide for the generation of test sets as detailed above.

The test set generator is typically connected to the test bench. As such, during iterations of the design flow, the test set can be updated or adjusted based on any modifications made to the design. Connecting a test bench to a test set generator involves matching design elements referenced in the test bench to corresponding design elements with which the test set generator can use to generate test sequences. This is referred to herein as a map between the test bench and the test set generator. Although most conventional test set generator tools are able to produce a reasonably complete map for a number of different hardware description languages, those of ordinary skill in the art will appreciate that the user must often modify the map somewhat at the start of the design process. During subsequent iterations of the design process then, these modifications may be eliminated as the map is updated to account for modifications to the design. As such, the user supplied sections of the map must be maintained during iterations of the design flow, in order to prevent the user from having to again modify the map.

BRIEF SUMMARY OF THE INVENTION

Aspects of the invention provide for the maintenance of user modified portions of a map between a test bench and a test set generator during an iterative electronic design process.

Various implementations of the invention provide for matching sections within a design for an electronic device with corresponding sections in a map between the elements in the design to elements in a graph representation of the design. The matched sections are then compared to determine if any discrepancies exists, such as, for example, if the design has been recently changed. If any discrepancies do exist, then it is determined whether the section of the map can be updated or must be replaced entirely to resolve the discrepancies. Various implementations of the invention provide that the process can be repeated during an iterative design flow such that as the design is modified during the iterative design flow, the map can be updated to reflect the changes.

With some implementations, a legend may be added to the map to designate sections of the map that have been modified by a user. Subsequently, if the designated sections of the map must be updated, then the user modified portions can be maintained.

These and additional implementations of invention will be further understood from the following detailed disclosure of illustrative embodiments.

BRIEF DESCRIPTION OF THE DRAWINGS

The present invention will be described by way of illustrative implementations shown in the accompanying drawings in which like references denote similar elements, and in which.

DETAILED DESCRIPTION OF THE INVENTION

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms like "generate" to describe the disclosed implementations. Such terms are often high-level abstractions of the actual operations that are performed. The actual operations that correspond to these terms will often vary depending on the particular implementation.

Some of the methods described herein can be implemented by software stored on a computer readable storage medium, or executed on a computer. Accordingly, some of the disclosed methods may be implemented as part of a computer implemented electronic design automation ("EDA") tool. The selected methods could be executed on a single computer or a computer networked with another computer or computers.

Illustrative Operating Environment

Figure 1:
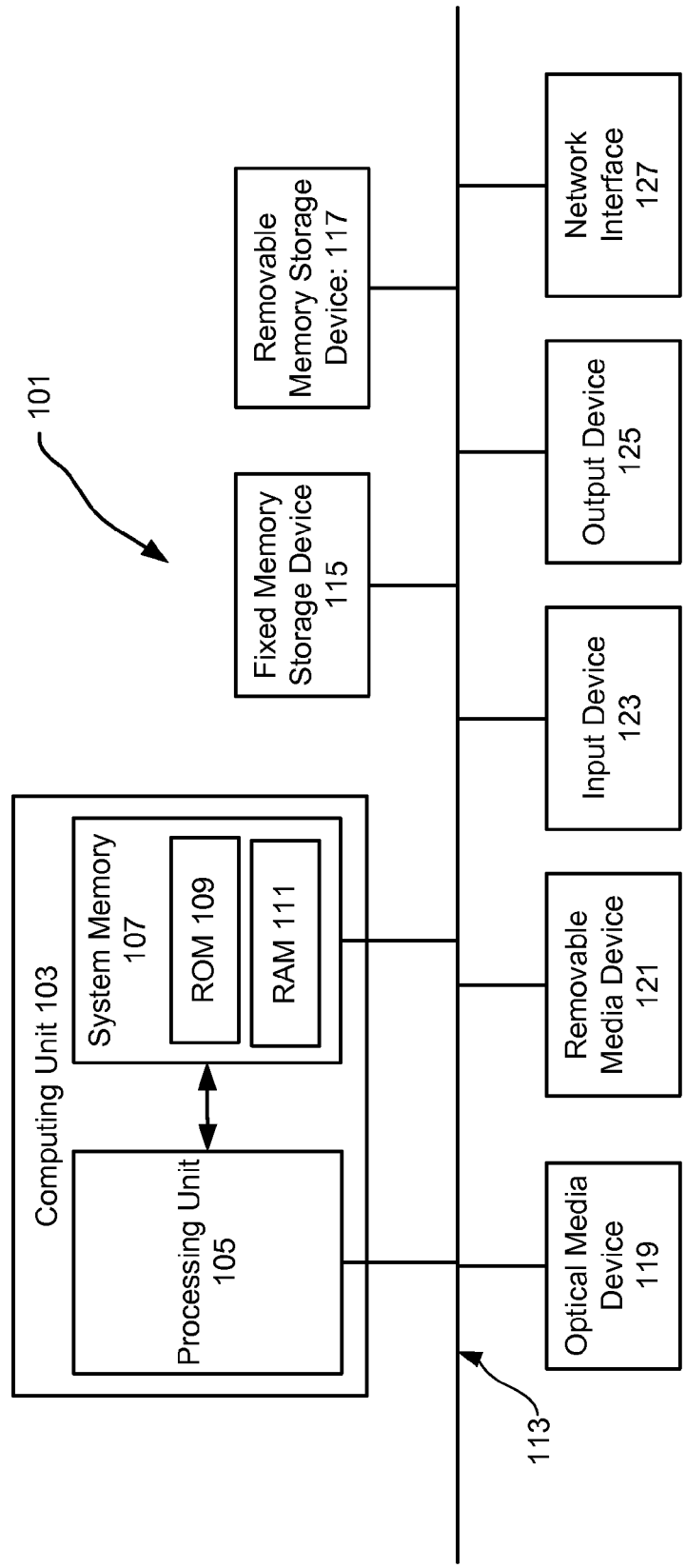
FIG. 1 illustrates a computing device.

As the techniques of the present invention may be implemented using software instructions, the components and operation of a computer system on which various implementations of the invention may be employed is described. Accordingly, FIG. 1 shows an illustrative computing device 101. As seen in this figure, the computing device 101 includes a computing unit 103 having a processing unit 105 and a system memory 107. The processing unit 105 may be any type of programmable electronic device for executing software instructions, but will conventionally be a microprocessor. The system memory 107 may include both a read-only memory ("ROM") 109 and a random access memory ("RAM") 111. As will be appreciated by those of ordinary skill in the art, both the ROM 109 and the RAM 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices, such as; a fixed memory storage device 115, for example, a magnetic disk drive; a removable memory storage device 117, for example, a removable solid state disk drive; an optical media device 119, for example, a digital video disk drive; or a removable media device 121, for example, a removable floppy drive. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus ("USB") connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol ("TCP") and the Internet protocol ("IP"). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

As stated above, various embodiments of the invention may be implemented using software instructions. These software instructions may be stored on one or more computer readable media or devices, such as, for example, the system memory 107, or an optical disk for use in the optical media device 119. As those of ordinary skill in the art will appreciate, software instructions stored in the manner described herein are inherently non-transitory in nature. More specifically, the software instructions are available for execution by the computer system 101, as opposed to being transmitted to the computer system via a carrier wave or some other transitory signal.

Iterative Design Flow Process

Figure 2:
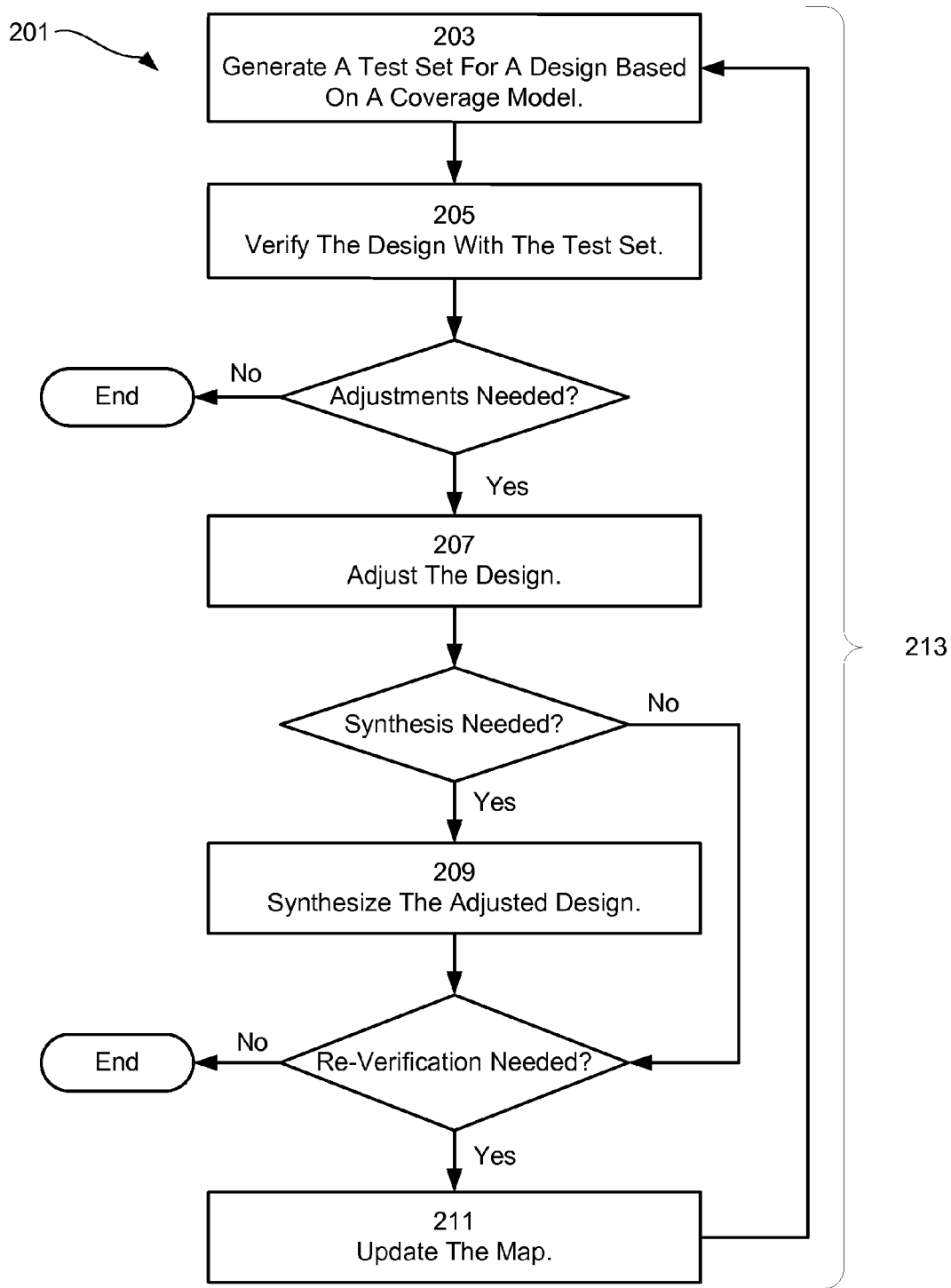
FIG. 2 illustrates an iterative electronic device design flow.
Figure 3:
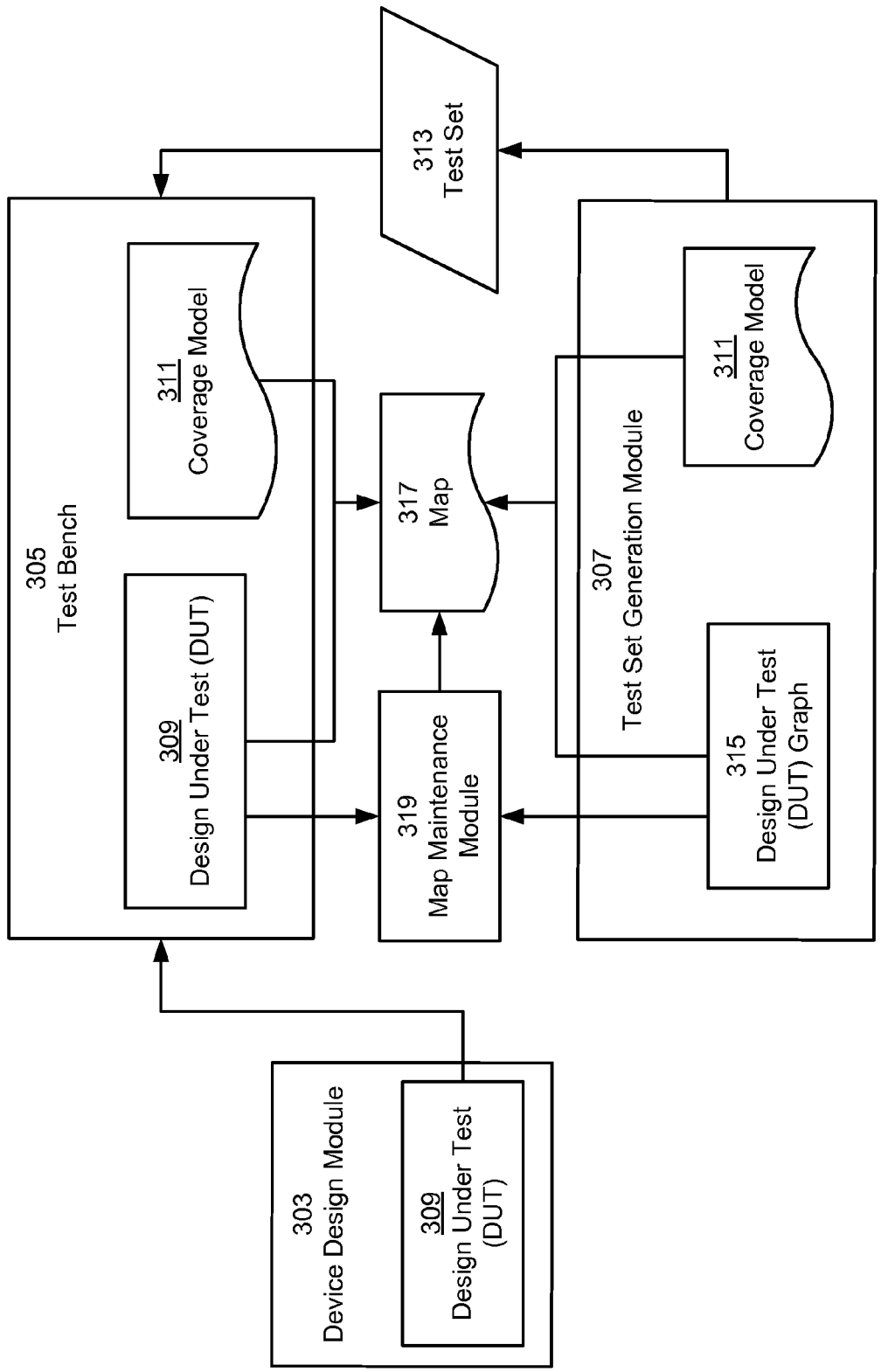
FIG. 3 illustrates an electronic device design environment.

As indicated above, aspects of the invention are directed towards maintaining a mapping between a test bench and a test set generator. FIG. 2 illustrates an iterative method 201, which may be included in a portion of a design flow for an electronic device. FIG. 3 illustrates a design flow environment 301, which may be provided to perform the method 201 shown in FIG. 2. Reference to these figures will be made in describing the various implementations of the invention and in describing the apparatuses and methods which may implement these implementations.

As can be seen from FIG. 3, the design environment 301 includes a device design module 303, a test bench 305, and a test set generation module 307. The device design module 303 is configured to allow for the interaction with an electronic device design, referred to as, a design under test (DUT) 309. More specifically, the device design module 303 allows for the modification and synthesis of the DUT 309. As detailed above, electronic designs are often expressed at different levels of abstraction. The design then is synthesized into subsequently lower and lower levels of abstraction until the design ultimately reflects what is needed to manufacture the device. The device design module 303 is configured to facilitate some or all of this part of the design process. Specifically, the device design module 303 is configured to allow modification of the DUT 309. Additionally, the device design module 303 may be configured to allow modification of the higher level design and the synthesis of the DUT 309 from this design.

As further indicated above, verification is often performed on the DUT 309 at various stages of the design flow. Accordingly, the test bench 305 is configured to facilitate the development and modification of a coverage model 311 for use in verification as well as to verify the DUT 309 based on a test set 313. The test set generation module 307 is configured to generate the test set 313 for the DUT 309 based on the coverage model 311.

Returning to FIG. 2, the method 201 includes an operation 203 for generating a test set for a design based on a coverage model. For example, the operation 203 could be applied to generate the test set 313 for the DUT 309 based on the coverage model 311. As indicated above, a number of different technologies exist for generating coverage based test sets. For example, in some implementations, the DUT 309 may be converted into a design under test (DUT) graph 315, which will be searched for unique input sequences that satisfy the constraints specified by the coverage model 311.

In order to convert the DUT 309 into the DUT graph 315, a mapping of the elements in the DUT 309 to corresponding graph elements needs to be made. More specifically, a map 317, which correlates elements within the DUT 309, such as, for example, structures or class fields used to specify the hardware component and connectivity of the DUT 309; with elements within the DUT graph 315, such as, for example, actions and meta-actions needs to be provided. Many test set generation modules, such as, for example, the InFact product available from Mentor Graphics Corporation of Wilsonville, Oreg., are capable of generating the map 317 for a number of different types of hardware description languages with which the DUT 309 may be expressed. However, as indicated above, with many cases the user will need to modify the map 317, for example, to account for user customizations in the hardware description language with which the DUT 309 is expressed in.

Once the test set 313 is generated by the test set generation module 307, the DUT 309 may be verified by the test bench 305. More specifically, the test bench 305 may be used to apply the input sequences in the test set 313 to the DUT 309 and then compare the response of the DUT 309 to an expected response, as detailed above. The method 201 includes an operation 205 for verifying the design with the test set. Based on the verification process, for example, if some of the expected outputs did not match the actual outputs, then the design may need to be modified so that the DUT 309 will perform as expected. Furthermore, as indicated above, other conditions may necessitate design modifications, such as, for example, changing design objectives. Accordingly, the method 201 provides an operation 207 for adjusting the design if needed.

With some implementations, the modifications may be made to the synthesized design, as such, no additional synthesis is needed. In some implementations, the modification will be made to the original design (i.e. the design at a higher level of abstraction,) as such; additional synthesis processes will need to be carried out such that the synthesized design (e.g. the DUT 309) includes the modifications. The method 201 then provides an operation 209 for synthesizing the adjusted design.

As those of ordinary skill in the art will appreciate, after changes are made to the DUT 309, it should be re-verified in order to ensure the errors that necessitated the changes have been corrected and that no new errors were introduced by the changes. As such, the method 201 includes an operation 211 for updating the map. More specifically, the operation 211 is provided to update the map between the DUT 309 and the DUT graph 315. The method 201 then returns to the operation 203 for generating a test set for the design. A single pass through the operations of the method 201 is referred to as a single iteration 213. Accordingly, for each modification (i.e. execution of the operation 209 for adjusting the design) another iteration of the method will typically be completed.

As mentioned above, the map 317 often includes customizations made by the user of the design flow environment 301. As such, during iterations 213 of the method 201, these customizations should be preserved or maintained. Accordingly, various implementations of the invention provide a map maintenance module 319 in the design flow environment 301. The map maintenance module 319 is configured to update the map 317 while preserving any user customized sections of the map 317.

Test Bench to Test Set Generator Map Maintenance

Figure 4:
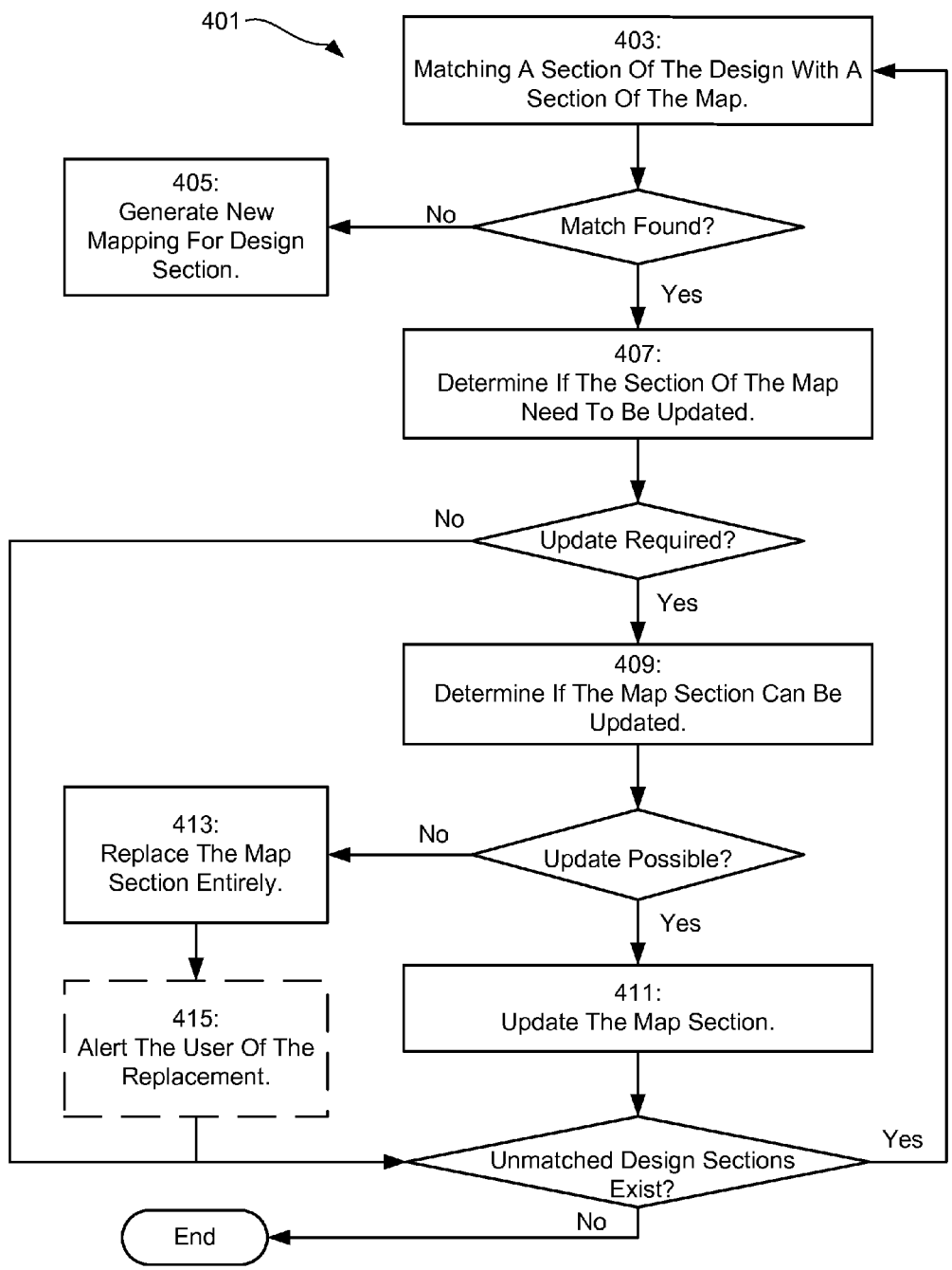
FIG. 4 illustrates a method of maintaining a map during an iterative design flow.

FIG. 4 illustrates a method 401 for maintaining the map 317. As can be seen from this figure, the method 401 includes an operation 403 for matching a section of the DUT 309 with a section of the map 317. If no matching section in the map 317 is found, such as, for example, if the DUT 309 section is new, then an operation 405 is provided for generating a corresponding section for the map 317. If a matching section is found in the map 317, then the method 401 provides an operation 407 for determining if the matched section needs to be updated, such as, for example, if the corresponding section of the DUT 309 has changed from the last iteration.

Sections of the map 317 that do not need to be updated, are left alone, as indicated by FIG. 4. However, for sections that do need updating, an operation 409 for determining if the section can be updated is provided. If it is determined that the section can be updated, then an operation 411 for updating the section to accurately map the elements in the DUT 309 to elements in the DUT graph 315 is provided. Conversely, if it is determined that the section cannot be updated, an operation 413 for replacing the section entirely is provided. Furthermore, in some implementations, an operation 415 for alerting the user of the replacement may be provided. Additionally, the method 401 provides that for unmatched section of the design, the operations of the method 401 can be repeated.

CONCLUSION

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A method, comprising:
    modifying, by a computing device, a first section of a map in accordance with user input requesting a customization to the first section of the map, wherein the map correlates elements of an electronic design under test to corresponding elements of a graph-based representation of the electronic design, and wherein the customization to the first section of the map is based on a customization of a hardware description language in which the electronic design is expressed;
    applying, to the elements of the electronic design, one or more test sequences that were generated based on the graph-based representation of the electronic design;
    modifying a first section of the electronic design based on an analysis of results from applying the one or more test sequences;
    determining that the first section of the map needs to be updated based on the first section of the electronic design being modified; and
    updating the first section of the map such that the customization to the first section of the map is preserved.

2. The method recited in claim 1, wherein updating the first section of the map includes replacing a portion of the first section of the map, and wherein the method further comprises:
    providing an indication that the portion of the map was replaced.

3. The method recited in claim 1, further comprising:
    matching a second section of the electronic design to a second section of the map;
    determining that the second section of the map needs to be updated; and
    replacing the section of the map with an updated section.

4. The method recited in claim 1, further comprising:
    performing an iterative process for updating the map, wherein the steps of claim 1 are performed during a first iteration and a second iteration includes:
    matching a second section of the electronic design to a second section of the map;
    determining if the second section of the map needs to be updated;
    determining if the second section of the map can be updated; and
    replacing the second section if it is determined that the first section of the map cannot be updated.

5. The method of claim 4, further comprising:
    providing an alert to a user of the replacing.

6. The method of claim 4, wherein determining if the second section of the map needs to be updated includes determining if the second section of the electronic design has changed from a previous iteration.

7. The method of claim 1, further comprising:
    attempting to match a second section of the electronic design to a second section of the map; and
    upon failing to match the second section of the electronic design, generating a mapping between the second section of the electronic design and one or more elements in the graph-based representation of the electronic design and adding the mapping to the map.

8. The method of claim 1, further comprising:
    after updating the first section of the map, re-applying, to the elements of the electronic design, the one or more test sequences that were generated based on the graph-based representation of the electronic design;
    modifying the first section of the electronic design a second time based on an analysis of results from the re-applying;
    determining that the first section of the map needs to be updated based on the first section of the electronic design being modified the second time; and
    updating the first section of the map such that the customization to the first section of the map is preserved a second time.

9. One or more computer-readable storage devices storing executable instructions that, when executed, cause an apparatus to:
- modify a first section of a map in accordance with user input requesting a customization to the first section of the map, wherein the map correlates elements of an electronic design under test to corresponding elements of a graph-based representation of the electronic design, and wherein the customization to the first section of the map is based on a customization of a hardware description language in which the electronic design is expressed;
- apply, to the elements of the electronic design, one or more test sequences that were generated based on the graph-based representation of the electronic design;
- modify a first section of the electronic design based on an analysis of results from applying the one or more test sequences;
- determine that the first section of the map needs to be updated based on the first section of the electronic design being modified; and
- update the first section of the map such that the customization to the first section of the map is preserved.

10. The one or more computer-readable storage devices recited in claim 9, wherein causing the apparatus to update the first section of the map includes causing the apparatus to replace a portion of the first section of the map, and wherein the executable instructions, when executed, cause the apparatus to:
- provide an indication that the portion of the map was replaced.

11. The one or more computer-readable storage devices recited in claim 9, wherein the executable instructions, when executed, cause the apparatus to:
- match a second section of the electronic design to a second section of the map;
- determine that the second section of the map needs to be updated; and
- replacing the section of the map with an updated section.

12. The one or more computer-readable storage devices recited in claim 9, wherein the executable instructions, when executed, cause the apparatus to:
- perform an iterative process for updating the map, wherein the executable instructions, when executed, cause the apparatus to perform the steps of claim 9 during a first iteration and wherein the executable instructions, when executed, cause the apparatus to perform a second iteration that comprises causing the apparatus to:
  - match a second section of the electronic design to a second section of the map;
  - determine if the second section of the map needs to be updated;
  - determine if the second section of the map can be updated; and
  - replace the second section if it is determined that the first section of the map cannot be updated.

13. The one or more computer-readable storage devices recited in claim 12, wherein causing the apparatus to determine if the second section of the map needs to be updated includes causing the apparatus to determine if the second section of the electronic design has changed from a previous iteration.

14. The one or more computer-readable storage devices recited in claim 9, wherein the executable instructions, when executed, cause the apparatus to:
- attempt to match a second section of the electronic design to a second section of the map; and
- upon failing to match the second section of the electronic design, generate a mapping between the second section of the electronic design and one or more elements in the graph based representation of the electronic design and adding the mapping to the map.

15. An apparatus, comprising:
one or more processors; and
memory storing executable instructions that, when executed by the one or more processors, cause the apparatus to:
- modify a first section of a map in accordance with user input requesting a customization to the first section of the map, wherein the map correlates elements of an electronic design under test to corresponding elements of a graph-based representation of the electronic design, and wherein the customization to the first section of the map is based on a customization of a hardware description language in which the electronic design is expressed;
- apply, to the elements of the electronic design, one or more test sequences that were generated based on the graph-based representation of the electronic design;
- modify a first section of the electronic design based on an analysis of results from applying the one or more test sequences;
- determine that the first section of the map needs to be updated based on the first section of the electronic design being modified; and
- update the first section of the map such that the customization to the first section of the map is preserved.

16. The apparatus recited in claim 15, wherein causing the apparatus to update the first section of the map includes causing the apparatus to replace a portion of the first section of the map, and wherein the executable instructions, when executed by the one or more processors, cause the apparatus to:
- provide an indication that the portion of the map was replaced.

17. The apparatus recited in claim 15, wherein the executable instructions, when executed by the one or more processors, cause the apparatus to:
- match a second section of the electronic design to a second section of the map;
- determine that the second section of the map needs to be updated; and
- replace the second section of the map with an updated section.

18. The apparatus recited in claim 14, wherein the executable instructions, when executed by the one or more processors, cause the apparatus to:
- perform an iterative process for updating the map, wherein the executable instructions, when executed by the one or more processors, cause the apparatus to perform the steps of claim 15 during a first iteration, and wherein the executable instructions, when executed by the one or more processors, cause the apparatus to perform a second iteration that comprises causing the apparatus to:
  - match a second section of the electronic design to a second section of the map;
  - determine if the second section of the map needs to be updated;
  - determine if the second section of the map can be updated; and
  - replace the second section if it is determined that the first section of the map cannot be updated.

19. The apparatus recited in claim 18, wherein causing the apparatus to determine if the second section of the map needs to be updated includes causing the apparatus to determine if the second section of the electronic design has changed from a previous iteration.

20. The apparatus recited in claim 15, wherein the executable instructions, when executed by the one or more processors, cause the apparatus to:
- attempt to match a second section of the electronic design to a second section of the map; and
- upon failing to match the second section of the electronic design, generate a mapping between the second section of the electronic design and one or more elements in the graph-based representation of the electronic design and adding the mapping to the map.

* * * * *

UNITED STATES PATENT AND TRADEMARK OFFICE
CERTIFICATE OF CORRECTION

| | |
|---|---|
| PATENT NO. | : 8,904,325 B2 |
| APPLICATION NO. | : 13/755686 |
| DATED | : December 2, 2014 |
| INVENTOR(S) | : Ballance |

Page 1 of 1

It is certified that error appears in the above-identified patent and that said Letters Patent is hereby corrected as shown below:

On the Title Page

Item (12) delete "Balance" and insert --Ballance--

Item (72) delete "Balance," and insert --Ballance,--

Signed and Sealed this
Fourteenth Day of July, 2015

Michelle K. Lee
*Director of the United States Patent and Trademark Office*